United States Patent [19]

Persson et al.

[11] 4,224,470
[45] Sep. 23, 1980

[54] HEADSET WITH LIMITER CIRCUIT

[76] Inventors: Leif A. T. Persson, Ragnvallagatan 22 A, 252 62 Helsingborg; Tord P. Lundin, 260 5 Rosengatan 5, Billesholm, both of Sweden

[21] Appl. No.: 15,359

[22] Filed: Feb. 26, 1979

Related U.S. Application Data

[63] Continuation of Ser. No. 856,909, Dec. 2, 1977, abandoned.

[30] Foreign Application Priority Data

Dec. 22, 1976 [SE] Sweden .................................. 7614482

[51] Int. Cl.² ............................................. H03G 3/30
[52] U.S. Cl. ................... 179/1 VL; 307/237; 179/1 P
[58] Field of Search ............... 179/1 VL, 1 P, 107 R, 179/81 R; 307/237

[56] References Cited

U.S. PATENT DOCUMENTS

| | | | |
|---|---|---|---|
| 3,306,991 | 2/1967 | Wood | 179/1 P |
| 3,959,602 | 5/1976 | Jayson | 179/81 R |
| 3,991,272 | 11/1976 | Tarr | 179/1 VL |
| 4,064,362 | 12/1977 | Williams | 179/1 P |
| 4,068,090 | 1/1978 | Komatsu et al. | 179/107 R |
| 4,079,211 | 3/1978 | Janssen | 179/81 R |

Primary Examiner—Malcolm A. Morrison

[57] ABSTRACT

Each of a pair of ear pads is provided with an electrically-operated earphone. The earphones are connected to each other by a circuit having a cord for connecting the earphones to an external audio-signal source. The circuit includes a pair of Zener diodes connected in back-to-back or opposed parallel relation to each other, and in parallel to the earphones so that if an incoming AC audio signal exceeds a predetermined value one of the diodes will fire to short the input signal, thus limiting the output (in decibels) of the earphones. A field-effect transistor is connected in series with the earphones to limit the current load thereto.

4 Claims, 4 Drawing Figures

HEADSET WITH LIMITER CIRCUIT

This is a continuation of application Ser. No. 856,909, filed Dec. 2, 1977 now abandoned.

The present invention relates to a headset consisting of two ear-pad casings each provided with an earphone connectable by a flexible cord to an external sound-signal source.

A type of ear-pad allowing communication with the wearer is already known. In this, the earphones may be connected to a signal source, e.g. a communications radio on a tractor, a walkie-talkie set, fixed equipment on a work-site, etc., by means of a flexible cord leading to the ear-pads, the free end of which is provided with a plug.

The sound reaching the ear of a person wearing ear-pad casings of the type described above originates partly in the external noise muffled by the ear-pads, and partly in the noise produced by the earphone itself.

A prerequisite of the efficient use of the present invention as ear-pads is thus that the sum of the sound levels of the two sound sources be no greater than 85 db (A) (equivalent sound level). This is rendered possible by reducing the attenuation of the ear-pads by 1 db (A), so that the sound level of the external noise muffled by the ear-pads is at the most 84 db (A), and at the same time limiting the equivalent sound level produced by the earphones to 80 db (A).

It is thus apparent that some device for limiting the sound level produced by the earphones must be incorporated in ear-pads of this type. Such devices, which are controlled and fed by a current from separate batteries, are known from earlier constructions but are of complicated and clumsy design and require, moreover, continuous maintenance in the shape of battery changes, etc.

The chief purpose of this invention, therefore, is to limit precisely the voltage in the earphones and by this means to limit the sound level produced by the earphones in the ear-pad casings, while still achieving light weight ear-pads needing neither batteries nor maintenance. A component particularly well suited to limiting voltage in this manner is the Zener diode, which clips the peaks of any incoming signal greater than the so-called Zener voltage. In the case of alternating currents it is clear that two Zener diodes will be necessary, these being connected in parallel and in opposed directions, and, in turn, mounted in parallel across the earphones. The advantages of this component are that Zener diodes are available offering great accuracy with regard to the Zener voltage, and at the same time no current need be supplied from outside batteries. If the transient voltage of the incoming signal is greater than the Zener voltage, the Zener diode becomes fully conducting; in other words, the output stage to which the ear-pads are connected to short-circuited.

Bearing in mind that the ear-pads can be connected to an output stage able to deliver considerable output power, and can thus receive input signals of such high level that a strong current flows through the Zener diode signal limiter, and thus short-circuits the output stage, a device for limiting the current must also be connected to the circuit. A component well suited to this purpose is the field-effect transistor, which, again, requires no current supplied from outside sources. This invention is therefore distinguished by a device introduced between the earphones and the signal source which, by means of Zener diodes, limits the voltage passing through the earphones and which, in consequence of the characteristic mode of action of the Zener diodes, limits as well the current received from the signal source by means of a field-effect transistor.

A suggested version of this invention is described in greater detail below by reference to the accompanying drawings.

Figure 1:
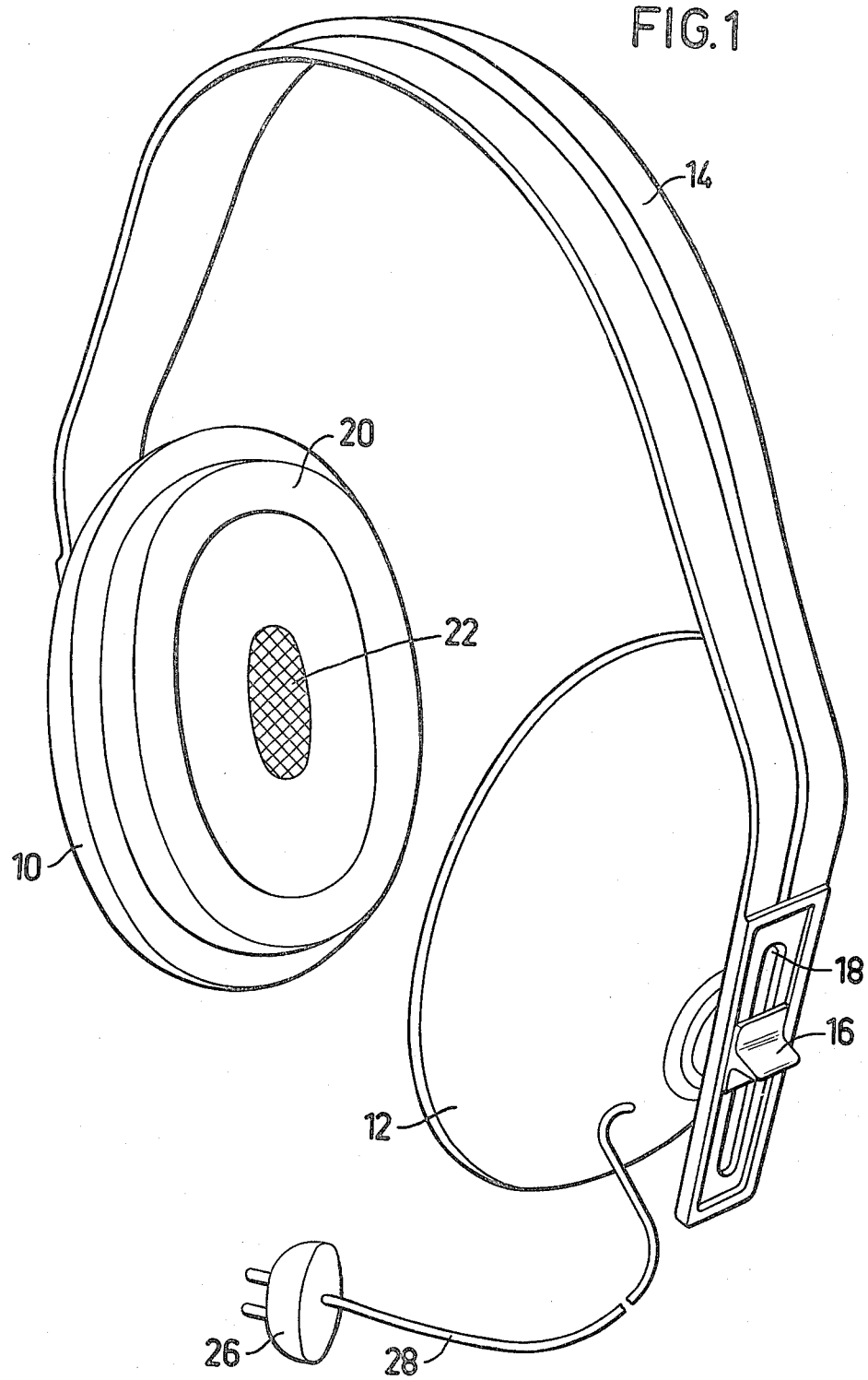
FIG. 1 shows a perspective view of conventional ear-pads modified by the addition of a device constructed according to the principles of this invention and rendering possible communication with the wearer of the ear-pads.

As in known methods of construction, the ear-pads shown in FIG. 1 comprise two casings 10, 12, connected to each other by means of a headband 14, which should preferably be of an elastic, hard plastic material. Each end of the headband 14 is provided with a grip 16 so attached to its appropriate casing 12 that the position of the casing can be adjusted along the length of a slot 18 which guides the grip 16. In FIG. 1 a section of the outward-facing part of an earphone 22 is visible through a pad 20 on casing 10, one such pad being mounted on each casing 10, 12 and designed to fit around the ear of the wearer. The earphones 22 and 24, which are mounted in the casings 10, 12, respectively, are electrically connected, and the wiring connecting them (not shown in FIG. 1) can run either inside or outside the headband 14. In addition to the earphone 24, the casing 12, which is shown to the right in FIG. 1, also contains the limiter circuit.

Incoming sound signals are received from an external signal source, not shown here, via a plug 26 and a flexible cord 28 running into the casing 12.

The limiter circuit, which functions only upon reception of a sound signal through the flexible cord 28, serves both earphones 22, 24, but, as indicated above, is mounted only in that casing 12 from which runs the flexible cord 28 and its plug 26. It is, of course, possible to place the limiter circuit in other parts of the casing or at some other position between the signal source and the earphones.

Figure 3:
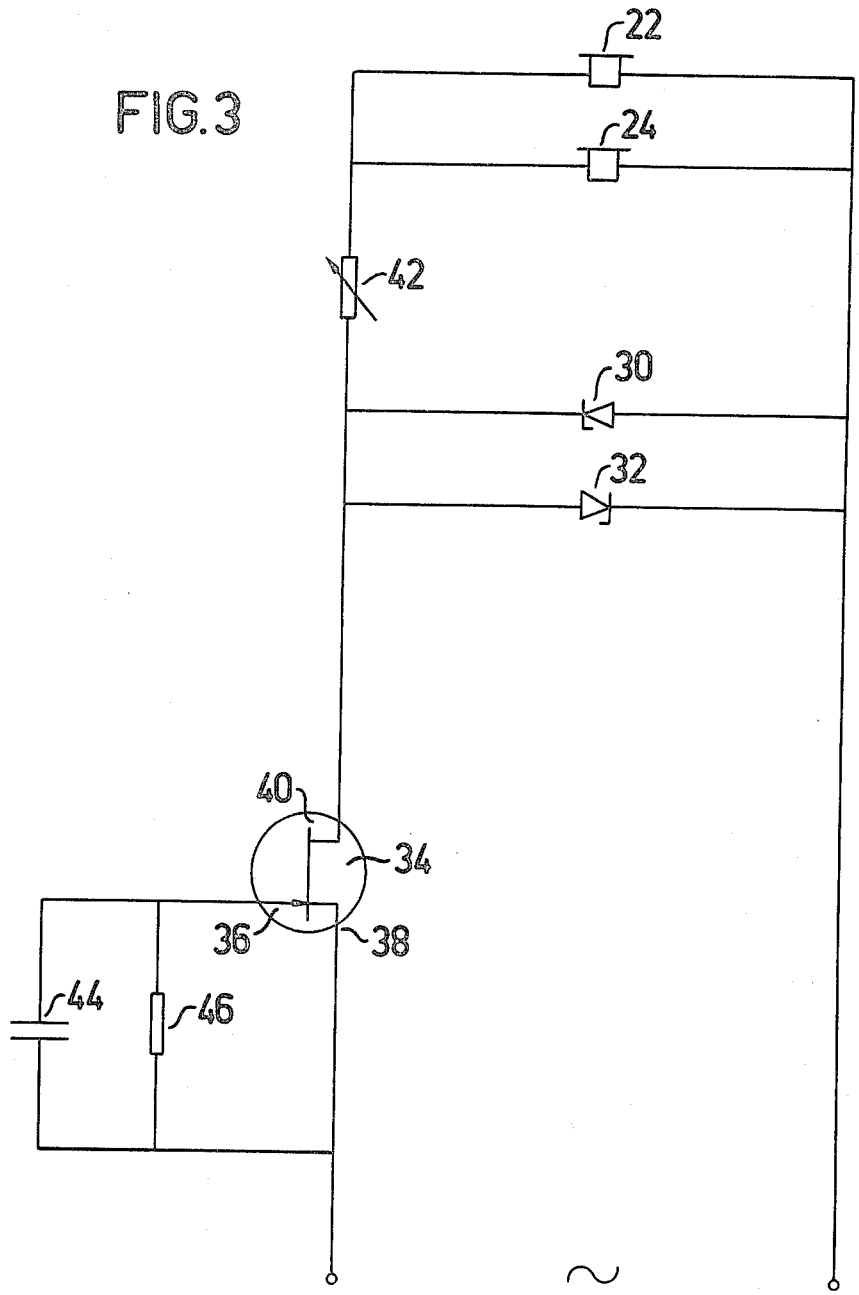
FIGS. 3 and 4 show examples of circuit diagrams for the current-limiting device incorporated in these ear-pads.
Figure 4:
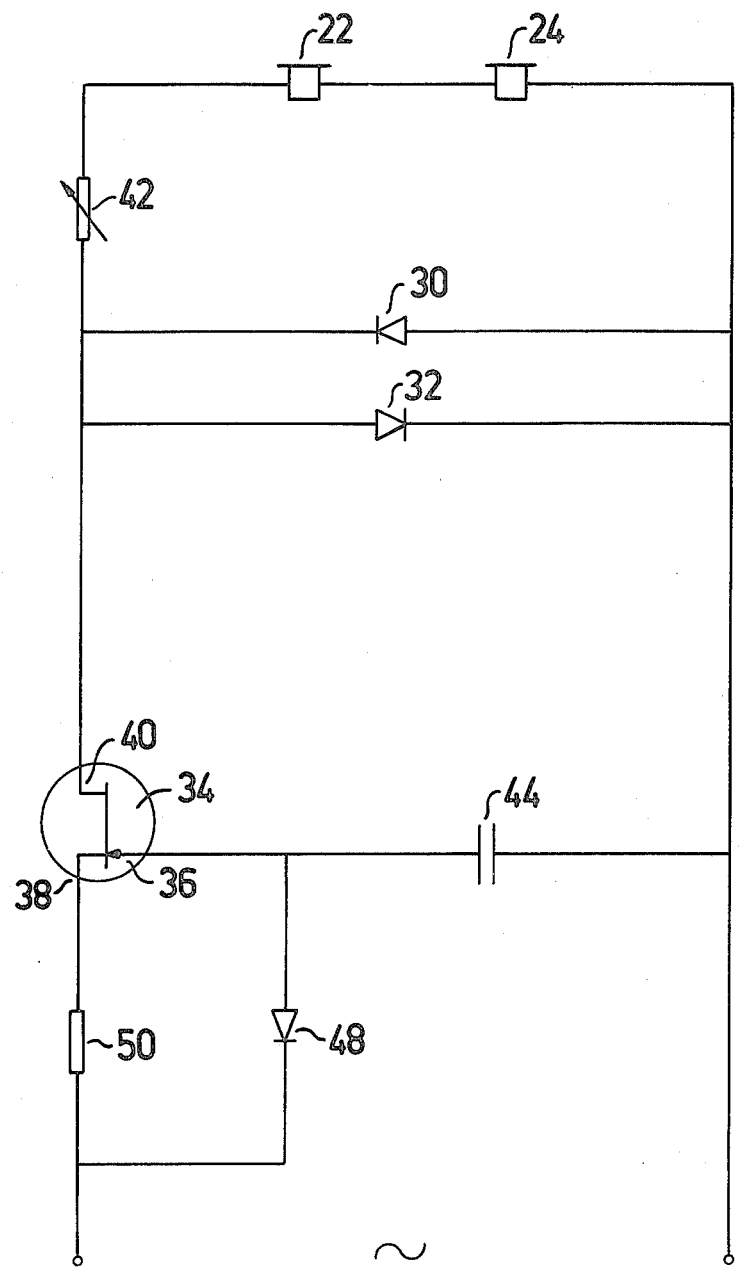

In the embodiment shown in FIG. 3 the two microphones 22, 24 are connected in parallel with each other, while in the embodiment of FIG. 4 they are connected in series. In each case, the limiter circuit, which as noted above may suitably be mounted in the earphone 24, consists of two stages, the first of which is designed to limit voltage to a degree of high precision, while the second is designed to provide fully adequate current regulation. The voltage-limiting stage includes two Zener diodes 30, 32 (FIGS. 3 and 4) connected in parallel and in opposed directions across the earphones 22, 24. Clearly, more diodes can if necessary be connected in parallel circuit with the earphones.

It is also possible to include a variable resistor 42 (FIGS. 3 and 4) connected in series with the earphones 22, 24 and then connect the Zener diodes in parallel across the resistor and earphones 22, 24, the division of potential between earphones and resistor thus allowing adjustment of voltage limitation. Zener diodes are particularly suited to this purpose since they provide precisely defined limits within a wide range of signal intervals. It should, however, be borne in mind that ordinary diodes may also be used, in spite of the fact that their threshold voltages are not as well defined as in the case of Zener diodes. Zener diodes, therefore, clip the peaks of incoming signals at a given threshold voltage, known as the breakdown voltage.

Voltage limitation across the earphones may also be effected by the use of field-effect transistors, such that if the voltage of an incoming signal exceeds a given value, the potential of the control electrode is adjusted, partly by means of a capacitor, to such a level by comparison with the potential of the emitter that the transistor cuts off the channel current. This solution has, however, proved to be expensive, partly because of the fact that two field-effect transistors are needed, but also because the level of the signal at which the transistor comes into effect is dependent on its pinch-off voltage ($U_p$) and d.c. resistance, two parameters which, for field-effect transistors, can vary within a wide range (e.g. 0.5–9 V for pinch-off voltage, 100–150 ohms for d.c. resistance).

Requirements of the current-limiting stage are that it must be cheap to manufacture, must not require external current supply from, e.g., batteries in the casing, and, finally, that it must not distort signals to the earphones before they can be cut off by the Zener diodes. The active electrical component which meets these demands is thus the field-effect transistor 34 (FIGS. 3 and 4), the internal flow resistance of which, depending upon the potential difference of the control electrode and emitter 36, 38, can vary considerably. The collector of the transistor is denoted 40. In order to obtain potential differences of this magnitude, when only a.c. is available, a capacitor 44 should preferably be connected between the control electrode 36 of the transistor and a suitable place in the circuit. In order to enable this capacitor 44, for an n-type transistor 34, to discharge a negative potential in relation to the emitter 38 (if a p-type transistor is used, the capacitor must be charged positively by comparison with the emitter), a diode 48 or resistor must be connected between the control electrode and a suitable place in the circuit.

Figure 2:
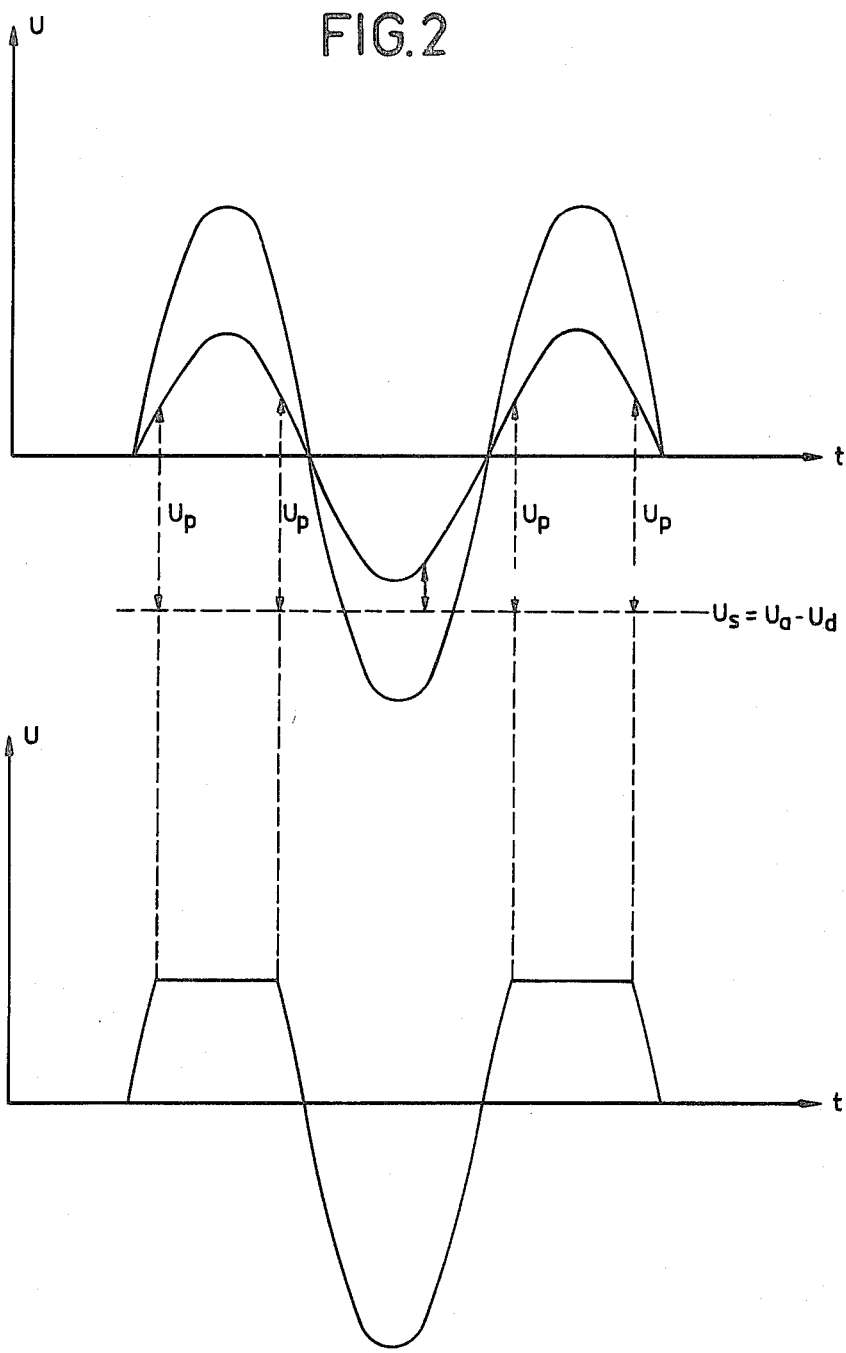
FIG. 2 shows graphically the function of the current-limiting device.

For a sinusoidal input signal (See FIG. 2), the control electrode 36 of the transistor 34 will therefore be charged with a negative potential ($U_s$) equal to the amplitude of the input signal ($U_a$) minus the voltage drop across that component which unloads the capacitor $U_d$ (both here and later we assume that the field-effect-transistor 34 is of the n-type, but a p-type could clearly be used just as well). The potential of the emitter will vary in step with the input signal but with an amplitude depending on how the potential of the circuit is divided. When the potential difference between the control electrode and the emitter reaches the pinch-off voltage ($U_p$) of the transistor, the current is cut off and the transistor remains cut off until the potential of the emitter has again dropped to $U_p-U_s$. This periodically recurring cut-off cycle is illustrated in the lower diagram of FIG. 2. From these two diagrams it is apparent that the lower the pinch-off voltage of the field-effect transistor 34, the lower will be the voltage required for the transistor to begin to function; and, moreover, the greater the input signal the larger that the part of the period which is cut off. In addition to this, cut-off function will be dependent on the potential of the emitter, which, in turn, is dependent on the distribution of voltage in the circuit.

The cut-off procedure described above thus offers a number of ways of connecting up those components required in conjunction with the field-effect transistor 34.

One alternative in designing a current-limiting circuit is to exclude the capacitor connected to the control electrode 36 of the transistor and instead to make use of the capacitance of the transistor itself, although since this capacitance is small the resulting current limitation will be inadequate. Another alternative is shown in FIG. 3, where, besides a capacitor 44, a resistor 46 is used. This resistor 46 is used in place of a diode to unload the capacitor 44. Because of the great dispersion values of d.c. resistance and pinch-off voltage, the current-limiting stage can begin to function at widely varying amplitudes of input signals, implying, in turn, that the function of the current-limiting stage may be imperilled or that too strong a current may flow through the circuit. In the version shown in FIG. 4, the effect of the dispersion of d.c. resistance has been avoided by the use of a transistor 34 having a low modal value of d.c. resistance by comparison with the resistor 50. As a result of this, most of the current is passed to the resistor, which, in turn, reduces the current in the transistor and thereby the effective output of the transistor, and allows the circuit to receive input signals of 40 V amplitude without difficulty. This means that the ear-pads can be connected to an output stage producing an effect in the range of 100 W across 8 ohms.

Having thus described our invention what we claim is:

1. A battery-free protective hearing aid headset for protecting the ears of the wearer from acoustical sound originating externally of the headset, and for receiving and converting into sound audible to the ears of the wearer, electronic signals from a source, such as a microphone, positioned remote from the headset, comprising two ear-pad casings, an electrically operated earphone mounted in each casing for converting electronic signals to sound, and means for operating said earphones including a flexible cord operatively connected at one end to said earphones and adapted to be connected at its opposite end to an external electronic signal source for supplying audio electrical signals to said earphones, each of said earphones being operable by said electrical signals without use of any separate voltage supply, said means further including a limiter circuit in one of said casings and connected between said signal source and said earphones to limit the sound level from the earphones to a value harmless to the wearer's hearing, and to limit the magnitudes of the signals applied to said earphones to values harmless to said earphones, and said limiter circuit being directly responsive to the signals from said source and comprising a first stage connected in parallel across the earphones and operative to limit the voltage applied to said earphones, and a second stage connected in series with said earphones and operative to limit the current flow therethrough, wherein said first stage comprises a pair of Zener diodes mounted in parallel and in opposed directions to each other, and connected in parallel with said earphones, and said second stage comprises a field-effect transistor having its collector-emitter circuit in series with said earphones.

2. The headset according to claim 1, wherein the earphones are connected in series.

3. The headset according to claim 1, wherein the earphones are connected in parallel.

4. The headset according to claim 1, wherein a resistor is connected in series with the earphones in order to regulate the sound volume of the earphones within the limit defined by the limiter circuit.

* * * * *

UNITED STATES PATENT OFFICE
CERTIFICATE OF CORRECTION

Patent No. 4,224,470　　　　　　Dated　September 23, 1980

Inventor(s) Lief-Anders Torsten Persson & Tord Rune Lundin

It is certified that error appears in the above-identified patent and that said Letters Patent are hereby corrected as shown below:

On the title page after the inventors paragraph [75], insert the following paragraph:

--[73] Assignee: Gullfiber A.B., Sweden--.

Signed and Sealed this

Fifth Day of April 1983

[SEAL]

Attest:

GERALD J. MOSSINGHOFF

Attesting Officer　　Commissioner of Patents and Trademarks